(12) United States Patent
Nakanishi et al.

(10) Patent No.: US 10,017,853 B2
(45) Date of Patent: Jul. 10, 2018

(54) PROCESSING METHOD OF SILICON NITRIDE FILM AND FORMING METHOD OF SILICON NITRIDE FILM

(71) Applicant: Tokyo Electron Limited, Tokyo (JP)

(72) Inventors: Toshio Nakanishi, Nirasaki (JP); Daisuke Katayama, Boise, ID (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/615,945

(22) Filed: Jun. 7, 2017

(65) Prior Publication Data
US 2017/0356084 A1    Dec. 14, 2017

(30) Foreign Application Priority Data

Jun. 14, 2016 (JP) ................................ 2016-117832

(51) Int. Cl.
| | | |
|---|---|---|
| H01L 21/31 | (2006.01) | |
| H01L 29/51 | (2006.01) | |
| H01L 21/475 | (2006.01) | |
| C23C 16/34 | (2006.01) | |
| C23C 16/46 | (2006.01) | |
| C23C 16/511 | (2006.01) | |
| C23C 16/56 | (2006.01) | |

(52) U.S. Cl.
CPC ............ *C23C 16/345* (2013.01); *C23C 16/46* (2013.01); *C23C 16/511* (2013.01); *C23C 16/56* (2013.01); *H01L 21/31* (2013.01); *H01L 21/475* (2013.01); *H01L 29/518* (2013.01)

(58) Field of Classification Search
CPC ............................ H01L 21/475; H01L 21/31
See application file for complete search history.

(56) References Cited

U.S. PATENT DOCUMENTS

| | | | | |
|---|---|---|---|---|
| 2004/0166696 A1* | 8/2004 | Lee | ................. | H01L 21/3185 438/792 |
| 2012/0315745 A1* | 12/2012 | Katayama | ............... | C23C 16/24 438/488 |
| 2015/0017785 A1* | 1/2015 | Gu | ................. | H01L 21/3221 438/473 |
| 2016/0196984 A1* | 7/2016 | Lill | ................. | C23C 16/458 438/694 |

FOREIGN PATENT DOCUMENTS

JP     2009-246129 A     10/2009

OTHER PUBLICATIONS

Narita, et al., "Composition Control of a SiN:H Film Deposited by PE-CVD Method", Fuji Electric Journal, vol. 78, No. 4, 2005.

* cited by examiner

*Primary Examiner* — Mounir Amer
(74) *Attorney, Agent, or Firm* — Pearne & Gordon LLP

(57) ABSTRACT

A processing method of a silicon nitride film can modify a silicon nitride film such that the silicon nitride film has a required characteristic even if it is formed at a low temperature by CVD. The processing method of the silicon nitride film formed on a substrate by plasma CVD includes modifying a surface portion of the silicon nitride film by irradiating microwave hydrogen plasma to the silicon nitride film to remove hydrogens in the surface portion of the silicon nitride film with atomic hydrogens contained in the microwave hydrogen plasma.

11 Claims, 5 Drawing Sheets

SAMPLE A (WITHOUT $H_2$ PLASMA PROCESSING)

SAMPLE B (WITH $H_2$ PLASMA PROCESSING)

PROCESSING METHOD OF SILICON NITRIDE FILM AND FORMING METHOD OF SILICON NITRIDE FILM

CROSS-REFERENCE TO RELATED APPLICATION

This application claims the benefit of Japanese Patent Application No. 2016-117832 filed on Jun. 14, 2016, the entire disclosures of which are incorporated herein by reference.

TECHNICAL FIELD

The embodiments described herein pertain generally to a processing method of a silicon nitride film and a forming method of a silicon nitride film.

BACKGROUND

In a semiconductor integrated circuit device, a silicon nitride film is widely utilized as an insulating film, a protective film, or the like. As a forming method of the silicon nitride film, there is known a plasma CVD method using a silicon source gas such as monosilane ($SiH_4$) or disilane ($Si_2H_6$) and a nitrogen-containing gas such as a nitrogen gas or an ammonia gas.

Meanwhile, it is also known that the silicon nitride film formed by the plasma CVD contains hydrogens (see, for example, Non-Patent Document 1) therein. Due to the presence of the hydrogens in the silicon nitride film, the silicon nitride film has a film characteristic worse than that of a silicon nitride film formed by heat. To solve this problem, Patent Document 1 describes a technique of reducing an amount of the hydrogen contained in the silicon nitride film by forming the silicon nitride film through plasma CVD in which plasma excited by microwave is used and a processing temperature, a composition ratio of a processing gas, a microwave power and a processing pressure are regulated to certain ranges.

Patent Document 1: Japanese Patent Laid-open Publication No. 2009-246129

Non-Patent Document 1: Fuji Electric Journal Vol. 78 No. 4 (2005), pages 64 to 67

Recently, when forming the silicon nitride film by the plasma CVD, it is required to perform the processing at a lower temperature in order to meet requirements for high integration and high performance of LSI. If, however, the film formation is performed at a low temperature, the amount of the hydrogen contained in the silicon nitride film cannot be reduced sufficiently just by adjusting the film forming conditions, so that a required characteristic may not be achieved. For example, though a silicon nitride film to be used as a hard mask needs to be formed at a low temperature, if the silicon nitride film is formed at the low temperature, it is difficult to obtain high resistance (etching selectivity) in wet etching and dry etching, which is necessary for the hard mask.

SUMMARY

In view of the foregoing, exemplary embodiments provide a forming method of a silicon nitride film and a processing method of a silicon nitride film capable of modifying the silicon nitride film such that the silicon nitride film has a required characteristic even if it is formed at a low temperature by CVD.

In one exemplary embodiment, there is provided a processing method of a silicon nitride film formed on a substrate by plasma CVD. Here, the processing method of the silicon nitride film includes modifying a surface portion of the silicon nitride film by irradiating microwave hydrogen plasma to the silicon nitride film to remove hydrogens in the surface portion of the silicon nitride film with atomic hydrogens contained in the microwave hydrogen plasma.

It is desirable that the silicon nitride film is formed by microwave plasma CVD. The microwave hydrogen plasma may be generated by exciting a hydrogen gas, or by exciting a hydrogen gas and an inert gas with microwave.

A processing temperature when irradiating the microwave hydrogen plasma is in a range from 200° C. to 500° C. A processing pressure when irradiating the microwave hydrogen plasma is in a range from 10 Pa to 100 Pa. A depth of a modified portion of the surface portion of the silicon nitride film is equal to or larger than 10 nm.

It is desirable that the irradiating of the microwave hydrogen plasma is performed by a RLSA (registered trademark) microwave plasma processing apparatus.

In another exemplary embodiment, a forming method of a silicon nitride film includes a first process of forming a silicon nitride film on a substrate by plasma CVD; and a second process of performing the processing method of the silicon nitride film as described in the one exemplary embodiment on the formed silicon nitride film.

It is desirable that first process is performed by microwave plasma. It is desirable that the first process and the second process are performed consecutively in a same microwave plasma processing apparatus. In this case, the microwave plasma processing apparatus is a RLSA (registered trademark) microwave plasma processing apparatus. It is desirable that first process and the second process are performed at a same processing temperature.

It is desirable that a processing temperature of the first process is in a range from 200° C. to 500° C. Further, it is desirable that a processing pressure of the first process is in a range from 10 Pa to 100 Pa.

According to the exemplary embodiments, by irradiating the microwave hydrogen plasma to the silicon nitride film to remove the hydrogens in the surface portion of the silicon nitride film with the atomic hydrogens contained in the microwave plasma, the corresponding surface portion is modified. As a result, it is possible to obtain a silicon nitride film having a required characteristic, for example, high selectivity for wet etching or dry etching.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
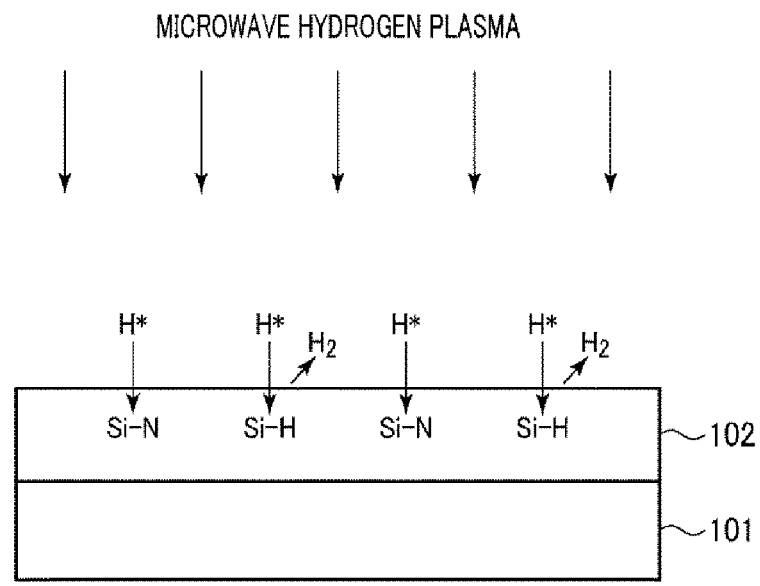
FIG. 1 is a diagram for describing a principle of the present disclosure.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments will be explained in detail with reference to the accompanying drawings. It should be noted that the following exemplary embodiments are not intended to be anyway limiting.

<Processing Method of SiN Film>

First, a processing method of a silicon nitride film according to an exemplary embodiment will be described.

When forming a silicon nitride film (hereinafter, referred to as "SiN film") by plasma CVD, a silane-based gas such as a SiH$_4$ gas is typically used as a silicon source gas, and hydrogens are contained in the source material. Further, a NH$_3$ gas containing hydrogen may be used as a nitrogen-containing gas. Therefore, the SiN film formed by the plasma CVD inevitably contains hydrogens (H).

As stated above, with the recent trend for high integration and high performance of LSI, it is required to form the SiN film at a lower temperature, and, as a consequence, the amount of the hydrogen in the formed SiN film is increased, so that a film characteristic is deteriorated. Particularly, when the silicon nitride film is used as a hard mask, it is difficult to achieve high resistance (etching selectivity) in wet etching and dry etching, which is necessary for the hard mask. Further, if the amount of the hydrogen in the SiN film is increased by the film formation at the low temperature, it becomes difficult to obtain a desired characteristic such as etching selectivity just by adjusting the film forming condition as in Patent Document 1.

In view of this problem, according to the present exemplary embodiment, by irradiating microwave hydrogen plasma to a SiN film formed on a surface of a substrate through the plasma CVD, hydrogens (H) in a surface portion of the SiN film are removed by atomic hydrogens (hydrogen radicals) in the plasma, so that the SiN film is modified.

Further, the microwave hydrogen plasma is plasma generated by exciting, with a microwave, only a hydrogen gas (H$_2$ gas) or a mixed gas in which a H$_2$ gas is diluted with a rare gas (e.g., an Ar gas).

Now, the mechanism of this processing is illustrated in FIG. 1. A reference numeral 101 denotes a substrate, and a reference numeral 102 refers to a SiN film formed by plasma CVD. Microwave plasma has a low electron temperature but has a high electron density. Thus, in case of irradiating the microwave hydrogen plasma to the SiN film 102, a large amount of atomic hydrogens (hydrogen radicals: H*) is included in the hydrogen plasma excited by the microwave, and ion energy of the plasma can be made low, which is lower than Si—N binding energy. Accordingly, by irradiating the microwave hydrogen plasma to the SiN film, H is removed from Si—H bonds in the SiN film in the form of H$_2$ mainly by H in the plasma without disassembling Si—N bonds in the surface portion of the SiN film. Thus, the surface portion of the SiN film is modified into a state where the amount of the hydrogens is less whereas a density thereof is higher. As the surface of the SiN film is modified as stated above, the SiN film can have the desired characteristic (e.g., high selectivity for the wet etching or the dry etching) even if the SiN film is formed at the low temperature.

Here, it is desirable that a thickness of the modified surface portion is equal to or larger than 10 nm. In this thickness range, the high selectivity for the wet etching or the dry etching can be achieved. Further, though there is no particular upper limit, the thickness up to 30 nm is practical.

Although inductively coupled plasma (ICP) is known as high-density plasma, ion energy of ICP is larger than that of Si—N binding energy. Thus, it is difficult to remove H in the silicon nitride film without disassembling the Si—N bonds of the SiN film.

Figure 2:
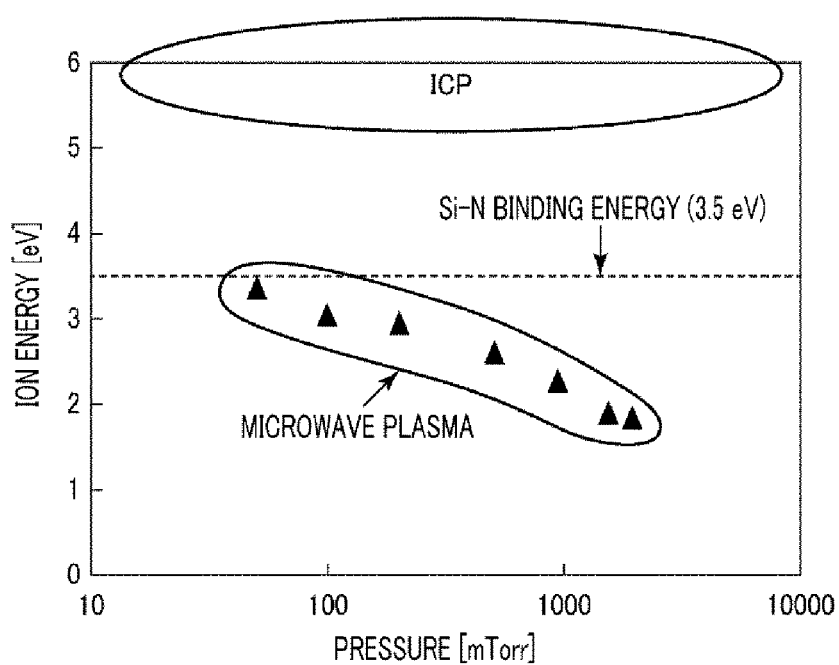
FIG. 2 is a diagram showing ion energy of microwave plasma in comparison with inductively coupled plasma (ICP)

This is illustrated in FIG. 2. FIG. 2 is a diagram showing a comparison of the ion energy of the microwave plasma and the ICP. In FIG. 2, a horizontal axis represents a pressure, and a vertical axis indicates the ion energy converted from an electron temperature measured by Langmuir probe.

As depicted in FIG. 2, the ion energy of the ICP is about 6 eV, which is higher than 3.5 eV of the Si—N bond. In contrast, in case of the microwave plasma, the ion energy can be set to be smaller than 3.5 eV of the Si—N bond by adjusting the pressure.

Conventionally, hydrogen plasma is mainly utilized in a reduction processing. However, the microwave hydrogen plasma processing of the present exemplary embodiment is not the reduction processing but is a processing of modifying the SiN film by scavenging the bond H existing in the SiN film with the H* in the plasma, which is an inventive concept which has not conventionally conceived.

Appropriately, the microwave hydrogen plasma may be generated by a RLSA (registered trademark) microwave plasma processing apparatus. In this type of apparatus, a planar antenna having slots is provided above a chamber (processing vessel) in which a substrate is accommodated, and a surface wave plasma is generated directly under a dielectric window forming a ceiling wall of the chamber by introducing a microwave induced from a microwave generating source into the chamber through the slots of the planar antenna and the dielectric window.

In the surface wave plasma generated by the RLSA (registered trademark) microwave plasma processing apparatus, the microwave is diffused only directly under the dielectric window as a surface wave, so that electrons in the plasma are accelerated in that region. However, by locating the substrate at a position lower than that region where the surface wave exists, acceleration of electrons is not performed at the substrate position, so that plasma having a low electron temperature can be obtained. Furthermore, since the substrate can be placed in the vicinity of the surface wave region, the processing can be performed with a high plasma density.

A gas introduced to generate the hydrogen plasma in the present exemplary embodiment may not only be the 100% of the $H_2$ gas as stated above but also be a mixed gas in which a $H_2$ gas is mixed with a rare gas such as an Ar gas. In such a case, it is desirable that the ratio of the rare gas is equal to or less than 90% (mol %). Besides the Ar gas, Kr, He, Ne or Xe may be used as the rare gas.

When performing the microwave hydrogen plasma processing, a temperature of the substrate may be desirably in a range from 200° C. to 500° C. Further, desirably, a processing pressure may be in a range from 10 Pa to 100 Pa (75 mTorr to 750 mTorr). The reason for this is as follows. To get ion energy smaller than a binding energy of a target film, it is desirable that the processing pressure is low. Furthermore, considering that the microwave hydrogen plasma processing is performed immediately after the film forming processing of the SiN film under the same condition, if the processing pressure reaches about 100 Pa, it may be difficult to generate plasma suitable for the film formation. Moreover, it is desirable that a power density of the microwave is in a range from 0.01 W/cm$^2$ to 0.04 W/cm$^2$. In addition, though a processing time varies depending on the power density, it is desirable that the processing time ranges from 15 sec to 300 sec.

<Forming Method of SiN Film>

Now, an exemplary embodiment of a forming method of a SiN film will be discussed.

The above-described processing method of the SiN film pertains to removing the hydrogens in the SiN film formed by the plasma CVD while processing the SiN film with the microwave hydrogen plasma. Since the microwave plasma has a low electron temperature and a high density, it is possible to form the SiN film at a low temperature through a radical reaction.

Figure 3:
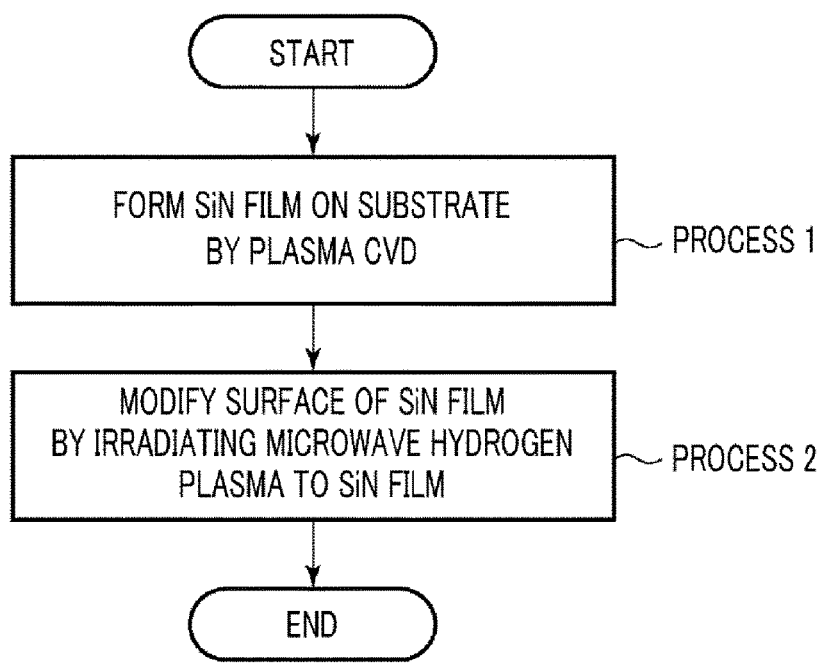
FIG. 3 is a flowchart showing a forming method of a silicon nitride film according to an exemplary embodiment.

Thus, in the present exemplary embodiment, as shown in FIG. 3, a SiN film is formed on a substrate by plasma CVD using microwave plasma (process 1). Then, a surface of the SiN film is modified by irradiating microwave hydrogen plasma to the SiN film formed as stated above (process 2), so that the SiN film having a desired characteristic can be obtained.

The film formation of the SiN film is performed by exciting a silicon source gas such as monosilane ($SiH_4$) or disilane ($Si_2H_6$) and a nitrogen-containing gas such as a nitrogen gas or an ammonia gas and then by allowing these excited gases to react on the substrate. As a plasma generation gas, a rare gas such as an Ar gas may be used. Besides the Ar gas, Kr, He, Ne or Xe may be used as the rare gas.

Since the microwave plasma has a low electron temperature and a high electron density as stated above, by forming the SiN film through the plasma CVD using the microwave plasma in the process 1, it is possible to form the SiN film having a good film quality even at a low temperature. If the SiN film is formed at the low temperature, however, the amount of H in the SiN film is increased even if the film formation is performed by the plasma CVD with the microwave plasma, so that a film characteristic such as etching selectivity is deteriorated. As a solution, after the film formation of the SiN film in the process 1, surface modification, in which the above-stated microwave hydrogen plasma is irradiated, is performed in the process 2.

As stated above, by performing both the film formation of the SiN film in the process 1 and the surface modification in the process 2 with the microwave plasma, these processes can be performed in a same apparatus consecutively. Particularly, it is desirable to perform these processes in the RLSA (registered trademark) microwave plasma processing apparatus.

When forming the SiN film in the process 1, a temperature of the substrate and a processing pressure may be set to range from 200° C. to 500° C. and 10 Pa to 100 Pa (75 mTorr to 750 mTorr), the same as in the surface modification by the microwave hydrogen plasma. It is desirable to perform the film formation of the SiN film in the process 1 and the surface modification in the process 2 at the same temperature.

<Microwave Plasma Processing Apparatus>

Now, an example of a microwave plasma processing apparatus suitable for the above-described processing method of the SiN film or the forming method of the SiN film will be explained.

Figure 4:
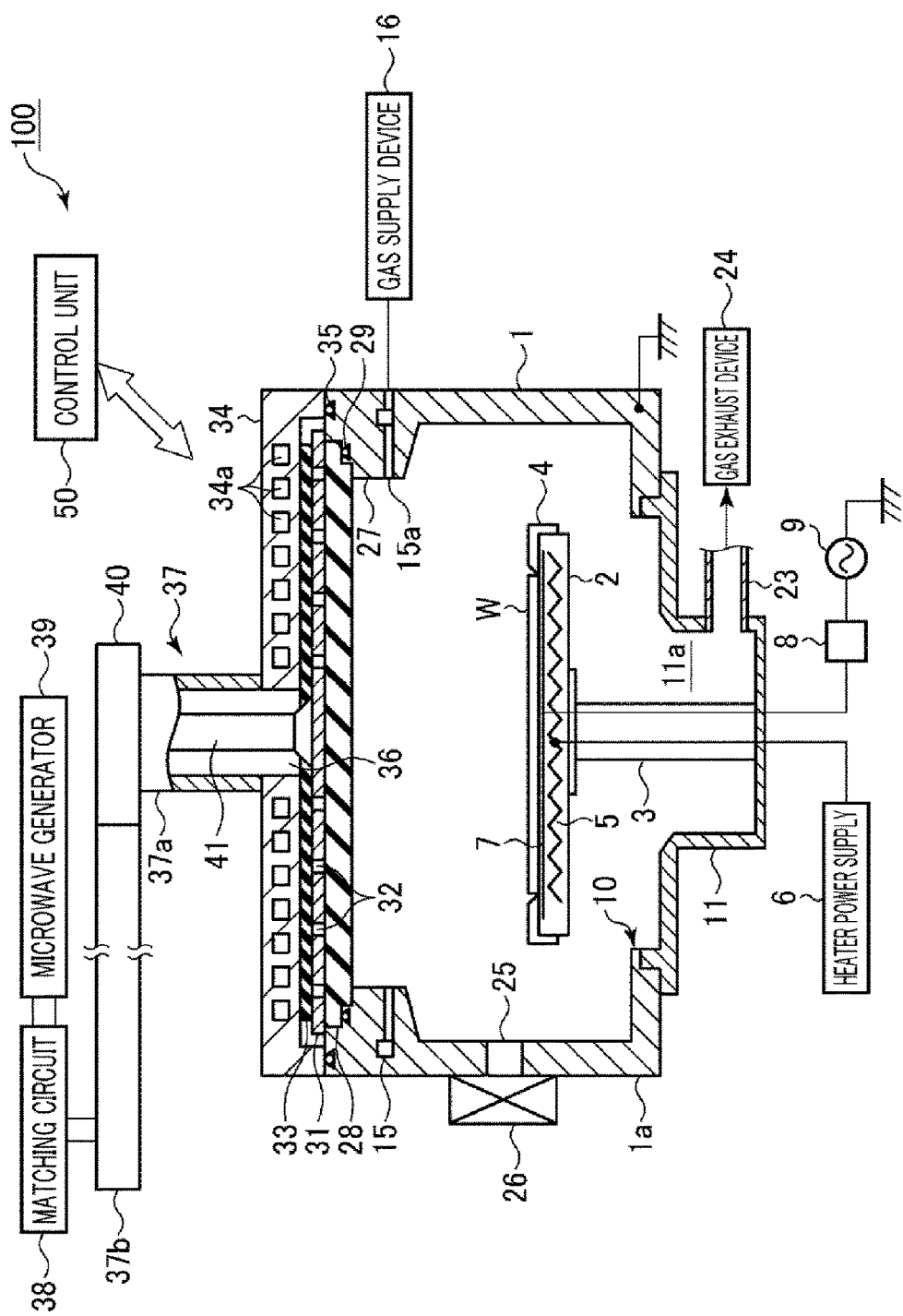
FIG. 4 is a diagram illustrating an example of a microwave plasma processing apparatus which is applicable to the present disclosure.

FIG. 4 is a cross sectional view illustrating the microwave plasma processing apparatus suitable for the processing method of the SiN film or the forming method of the SiN film according to the exemplary embodiments. The microwave plasma processing apparatus of FIG. 4 is configured as a RLSA (registered trademark) microwave plasma processing apparatus.

As depicted in FIG. 4, the microwave plasma processing apparatus 100 includes a substantially cylindrical chamber 1 which is hermetically sealed and grounded. A circular opening 10 is formed at a substantially central portion of a bottom wall 1a of the chamber 1, and a gas exhaust room 11 communicating with the opening 10 and protruded downwards is provided at the bottom wall 1a.

A susceptor 2 made of ceramic such as AlN is provided within the chamber 1 to support a substrate such as a semiconductor wafer (hereinafter, referred to as "wafer") W horizontally. This susceptor 2 is supported by a cylindrical supporting member 3 extended upwards from a center of a bottom portion of the gas exhaust room 11 and made of ceramic such as AlN. A guide ring 4 for guiding the wafer W is provided at a peripheral portion of the susceptor 2. Further, a resistance heating type heater 5 is embedded in the susceptor 2. As a power is fed from a heater power supply 6, the heater 5 heats the susceptor 2, so that the wafer W is heated. Further, an electrode 7 is embedded in the susceptor 2, and a high frequency power supply 9 for bias application is connected to the electrode 7 via a matching device 8.

The susceptor 2 is provided with wafer supporting pins (not shown) which are configured to be protruded from and retracted below a surface of the susceptor 2 to elevate the wafer W up and down while supporting the wafer W.

An annular gas inlet unit 15 is provided at a sidewall of the chamber 1, and gas discharge holes 15a are uniformly formed in the gas inlet unit 15. This gas inlet unit 15 is connected with a gas supply device 16.

The gas supply device 16 includes a rare gas supply source configured to supply a rare gas such as an Ar gas serving as a plasma generation gas, a $H_2$ gas supply source configured to supply a $H_2$ gas, a silicon source gas supply source configured to supply a silicon source gas such as monosilane ($SiH_4$) and disilane ($Si_2H_6$), and a nitrogen-containing gas supply source configured to supply a nitrogen-containing gas such as a nitrogen gas or ammonia. These gases are supplied to the gas inlet unit 15 through individual pipelines while flow rates thereof are independently controlled by flow rate controllers such as mass flow controllers. Further, in case that only surface modification of the SiN film is performed in the plasma processing apparatus 100, the gas supply device 16 only needs to have the $H_2$ gas supply source and the rare gas supply source.

It is desirable that a gas such as the silicon source gas is not dissociated completely by plasma. For the purpose, a separate gas inlet unit such as a shower plate may be additionally provided under the gas inlet unit 15, and the gas such as the silicon source gas may be introduced from this separate gas inlet unit into a region which is closer to the wafer W and has a lower electron temperature.

A gas exhaust line 23 is connected to a lateral side of the gas exhaust room 11, and a gas exhaust device 24 including a vacuum pump, an automatic pressure control valve, and so forth is connected to the gas exhaust line 23. By operating the vacuum pump of the gas exhaust device 24, a gas within the chamber 1 is uniformly discharged into a space 11a within the gas exhaust room 11 to be exhausted through the gas exhaust line 23, so that the inside of the chamber 1 can be controlled to have a preset vacuum level by the automatic pressure control valve.

Provided at the sidewall of the chamber 1 are a carry-in/out opening 25 through which the wafer W is transferred between the chamber 1 and a transfer chamber (not shown) adjacent to the plasma processing apparatus 100; and a gate valve 26 configured to open or close the carry-in/out opening 25.

The upper portion of the chamber 1 is configured as an opening, and a peripheral portion of the opening is configured as a ring-shaped supporting portion 27. A circular plate-shaped microwave transmission plate 28 made of a dielectric material, e.g., ceramic such as, but not limited to, quartz or $Al_2O_3$ is airtightly provided on the supporting portion 27 via a seal member 29. Thus, the chamber 1 is kept hermetically.

On the microwave transmission plate 28, a planar antenna 31 having a circular plate shape corresponding to the microwave transmission plate 28 is provided in firm contact with the microwave transmission plate 28. The planar antenna 31 is supported by an upper end of the sidewall of the chamber 1. The planar antenna 31 is implemented by a circular plate made of a conductive material. To elaborate, the planar antenna 31 is formed of a copper plate or aluminum plate having a surface coated with silver or gold, and is provided with a multiple number of microwave radiation holes 32 (slots) formed through the planar antenna 31 in a preset pattern. As an example of the pattern, two microwave radiation holes 32 arranged in a T shape are formed as a pair, and multiple pairs of microwave radiation holes 32 may be arranged concentrically. A length of the microwave radiation hole 32 and a spacing therebetween depend on a wavelength $\lambda g$ of a microwave. By way of example, the microwave radiation holes 32 may be arranged such that they are spaced apart from each other at a distance of $\lambda g/4$, $\lambda g/2$ or $\lambda g$. Furthermore, the microwave radiation hole 32 may have various shapes such as a circular shape, an arc shape, and so forth. Moreover, the arrangement of the microwave radiation holes 32 may not be limited to the aforementioned example. That is, besides the concentric shape, they may be arranged in, for example, a spiral shape, a radial shape, and so forth.

Provided on and in firm contact with a top surface of the planar antenna 31 is a wavelength shortening member 33 made of a dielectric material having a dielectric constant higher than vacuum, such as quartz or a resin such as polytetrafluoroethylene or polyimide. This wavelength shortening member 33 is configured to shorten the wavelength of the microwave to be smaller than that in vacuum, so that the planar antenna 31 is allowed to be reduced in size. A phase of the microwave can be controlled by adjusting a thickness of the wavelength shortening member 33. Thus, by adjusting the thickness of the wavelength shortening member 33 such that the antinode of the standing wave occurs at a joint portion to the planar antenna 31, radiation energy of the microwave can be maximized.

Furthermore, though the planar antenna 31 and the microwave transmission plate 28, and the wavelength shortening member 33 and the planar antenna 31 are respectively arranged in firm contact with each other, they may be arranged spaced apart from each other.

Provided at a top surface of the chamber 1 is a shield cover body 34 configured to cover the planar antenna 31 and the wavelength shortening member 33. The shield cover body 34 is made of a metal such as stainless steel, copper or aluminum. The top surface of the chamber 1 and the shied cover body 34 are sealed by a seal member 35. A cooling water path 34a is formed in the shield cover body 34. By flowing cooling water into the cooling water path 34a, the shield cover body 34, the wavelength shortening member 33, the planar antenna 31 and the microwave transmission plate 28 can be cooled. Further, the shield cover body 34 is grounded.

An opening 36 is formed at a center of an upper wall of the shield cover body 34, and a waveguide 37 is connected to this opening 36. A microwave generator 39 is connected to an end portion of the waveguide 37 via a matching circuit 38. Accordingly, a microwave having a frequency of, e.g., 2.45 GHz generated in the microwave generator 39 is propagated to the planar antenna 31 via the waveguide 37. Further, various frequencies such as 8.35 GHz, 1.98 GHz, 860 MHz and 915 MHz may be used as the frequency of the microwave.

The waveguide 37 includes a coaxial waveguide 37a having a circular cross-sectional shape extended upwards from the opening 36 of the shield cover body 34; and a rectangular waveguide 37b connected to an upper end portion of the coaxial waveguide 37a via a mode converter 40 and extended in a horizontal direction. The mode converter 40 provided between the rectangular waveguide 37b and the coaxial waveguide 37a is configured to convert a microwave of a TE mode transmitted in the rectangular waveguide 37b into a TEM mode. An internal conductor 41 is extended in a center of the coaxial waveguide 37a, and a lower end of the internal conductor 41 is connected to and fixed to a center of the planar antenna 31. Accordingly, the microwave is transmitted to the planar antenna 31 uniformly and efficiently through the internal conductor 41 of the coaxial waveguide 37a.

The microwave plasma processing apparatus 100 includes a control unit 50. The control unit 50 includes a main controller having a CPU configured to control individual components of the microwave plasma processing apparatus 100, e.g., the microwave generator 39, the heater power supply 6, the high frequency power supply 9, the gas exhaust device 24, the valve or the flow rate controller of the gas supply device 16, and so forth. The control unit 50 also includes an input device (a key board, a mouse, etc.), an output device (a printer, etc.), a display device (a display, etc.) and a storage device (recording medium). The main controller of the control unit 50 controls the microwave plasma processing apparatus 100 to perform a preset operation based on a processing recipe stored in a recording medium embedded in or set in the storage device.

Now, an operation of the microwave plasma processing apparatus 100 having the above-described configuration in case of performing the film formation of the SiN film and the surface modification of the SiN film consecutively will be discussed.

First, the gate valve 26 is opened, and a wafer W to be subjected to a nitrification processing is carried into the chamber 1 through the carry-in/out opening 25, and is placed on the susceptor 2.

Then, a rare gas as the plasma generation gas, for example, an Ar gas is introduced into the chamber 1 from the gas supply device 16 via the gas inlet unit 15, and the microwave having a preset power level is induced from the microwave generator 39 into the waveguide 37 via the matching circuit 38. The microwave induced to the waveguide 37 is propagated within the rectangular waveguide 37b in the TE mode. The TE mode of the microwave is then converted into the TEM mode by the mode converter 40, and the microwave in the TEM mode is propagated within the coaxial waveguide 37a. Then, the microwave in the TEM mode is radiated into the chamber 1 via the wavelength shortening member 33, the slots 32 of the planar antenna 31 and the microwave transmission plate 28. The microwave is diffused only in a region directly under the microwave transmission plate 28 as a surface wave, so that surface wave plasma is generated. The plasma is diffused downwards to have a high electron density and a low electron temperature in a region where the wafer W is placed.

Meanwhile, the high frequency bias power for ion attraction is applied from the high frequency power supply 9 to the susceptor 2, and the silicon source gas such as monosilane ($SiH_4$) or disilane ($Si_2H_6$), and the nitrogen-containing gas such as a nitrogen gas or an ammonia gas, as a processing gas, are supplied into the chamber 1 from the gas supply device 16 via the gas inlet unit 15. The processing gas is excited by the plasma within the chamber 1 and dissociated into active species such as SiH and NH. These active species react on the wafer W, so that the SiN film is formed.

Further, it may be desirable that the gas such as the silicon source gas is not completely dissociated by the plasma. This gas may be introduced from the additional gas inlet unit such as the shower plate provided under the gas inlet unit 15 into the region which is closer to the wafer W and has a lower electron temperature, so that the dissociation of this gas may be suppressed.

As stated above, by forming the SiN film by the plasma CVD using the microwave plasma having the high electron density and the low electron temperature, a high quality film having less damage thereon can be formed at a low temperature.

When using an Ar gas as the plasma generation gas; a $SiH_4$ gas, as the Si source gas; and a $N_2$ gas, as the nitrogen-containing gas, desirable conditions are as follows.

Processing temperature (surface temperature of susceptor 2): 200° C. to 500° C.
Processing pressure: 10 Pa to 100 Pa (75 mTorr to 750 mTorr)
Ar gas flow rate: 0 mL/min to 1000 mL/min (sccm)
$SiH_4$ gas flow rate: 10 mL/min to 200 mL/min (sccm)
$N_2$ gas flow rate: 10 mL/min to 200 mL/min (sccm)
Microwave power density: 0.01 $W/cm^2$ to 0.04 $W/cm^2$ After the SiN film is formed as stated above, the supply of the microwave power and the supply of the gases are stopped, and the inside of the chamber 1 is purged by supplying the purge gas into the chamber 1 while evacuating the chamber 1 in the state that the wafer W having the SiN film formed thereon is maintained on the susceptor 2.

Subsequently, a $H_2$ gas or a mixed gas of a $H_2$ gas and a rare gas such as an Ar gas is introduced into the chamber 1 from the gas supply device 16 via the gas inlet unit 15 while maintaining the susceptor 2 at the same temperature, and the microwave of the preset power level is induced to the waveguide 37 from the microwave generator 39 via the matching circuit 38. The microwave induced to the waveguide 37 is propagated through the rectangular waveguide 37b in the TE mode, and is propagated to the coaxial waveguide 37a after being converted into the TEM mode by the mode converter 40. Then, the microwave in the TEM mode is transmitted through the wavelength shortening member 33, the slots 32 of the planar antenna 31 and the microwave transmission plate 28, so that the surface wave plasma is formed in the region directly under the microwave transmission plate 28. This plasma is diffused into the region where the wafer W is placed, so that the microwave hydrogen plasma is irradiated to the wafer.

As stated above, though the microwave plasma has the low electron temperature, it has the high electron density. Accordingly, the microwave hydrogen plasma generated by exciting the $H_2$ gas with the microwave exists as plasma which has a low ion energy and contains a large amount of H*. Therefore, the microwave hydrogen plasma can be irradiated to the SiN film in the state that the ion energy is lower than Si—N binding energy, and H is removed from Si—H bonds in the SiN film in the form of $H_2$ mainly by H* in the plasma without disassembling Si—N bonds in the surface portion of the SiN film. As a result, the surface portion of the SiN film is modified into the state having a less amount of the hydrogens. Accordingly, even when the SiN film is formed at the low temperature, the SiN film can be given a desired characteristic (for example, high selectivity for the wet etching or the dry etching).

Desirable conditions for the surface modification processing by the irradiation of the microwave hydrogen plasma are as follows.

Processing temperature (surface temperature of susceptor 2): 200° C. to 500° C.
Processing pressure: 10 Pa to 100 Pa (75 mTorr to 750 mTorr)
Ar gas flow rate: 0 mL/min to 1000 mL/min (sccm)
$H_2$ gas flow rate: 100 mL/min to 1000 mL/min (sccm)
Ar gas flow rate/$H_2$ gas flow rate: 0 to 0.9
Microwave power density: 0.01 $W/cm^2$ to 0.04 $W/cm^2$
Processing time: 30 sec to 600 sec
Thickness of modified surface portion: 10 nm or more As stated above, since the film formation of the SiN film and the surface modification of the SiN film can be consecutively performed in the single microwave plasma processing apparatus 100, the high-throughput processing can be performed. Particularly, by performing these processings at the same temperature, the throughput thereof can be further improved.

Furthermore, in the microwave plasma processing apparatus 100, only the surface modification processing by the microwave hydrogen plasma may be performed on the wafer W on which the SiN film is previously formed by another apparatus.

EXPERIMENTAL EXAMPLE

Figure 5A:
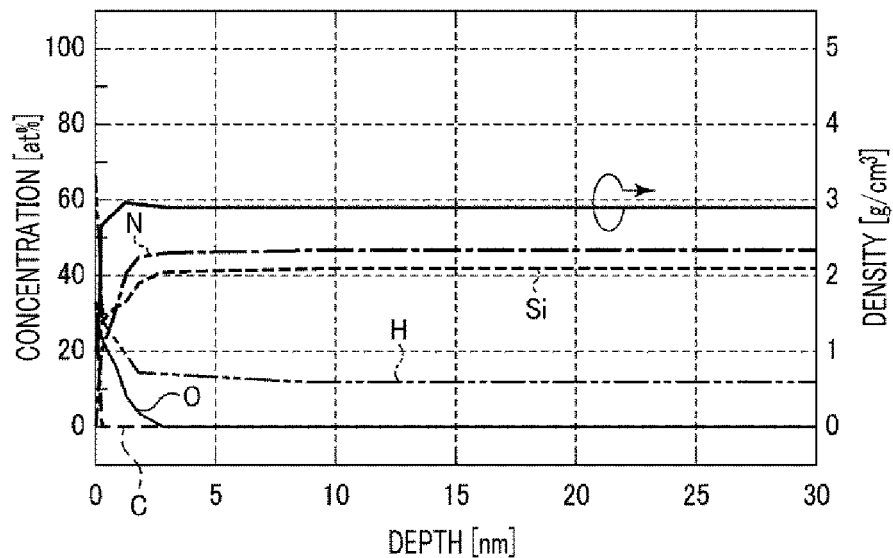
FIG. 5A and FIG. 5B are diagrams showing concentrations and densities of individual atoms of a sample A and a sample B in a depth direction in an experimental example.
Figure 5B:
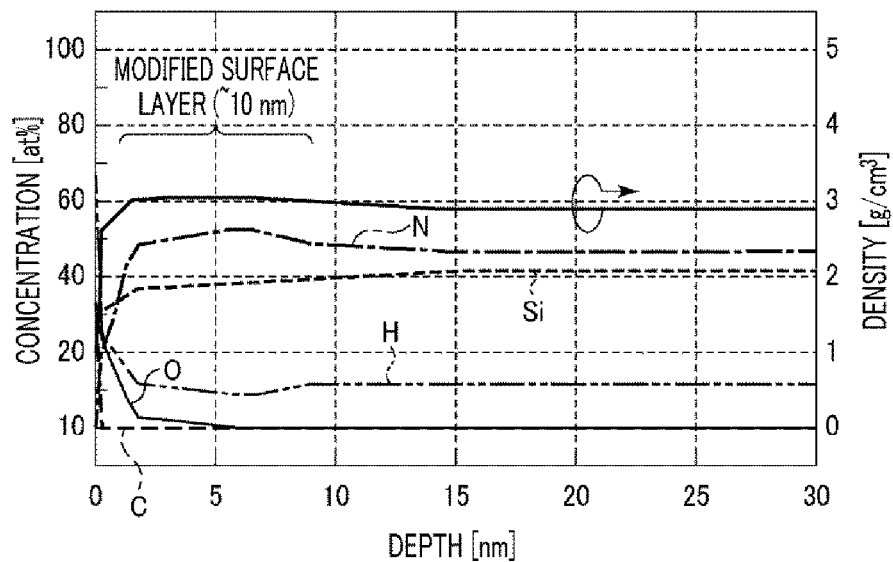

Now, an experimental example will be described.
Here, for a sample A having the SiN film formed on the silicon wafer by the plasma CVD (without $H_2$ plasma processing) and a sample B having the SiN film on which the surface modification processing is performed by irradiating the microwave hydrogen plasma (with $H_2$ plasma processing), concentrations and densities of individual elements in a depth direction of the SiN film are measured by RBS. The result is shown in FIG. 5A and FIG. 5B.

Further, conditions for the film formation of the SiN film and conditions for the surface modification of the SiN film are as follows.
  (i) Film formation of SiN film
  Ar gas flow rate: 600 sccm
  $SiH_4$ gas flow rate: 50 sccm
  $N_2$ gas flow rate: 50 sccm
  Microwave power density: 0.02 $W/cm^2$
  Processing time: 60 sec
  (ii) Surface modification processing
  Processing temperature: 320° C.
  Processing pressure: 20 Pa
  $H_2$ gas flow rate: 400 sccm
  Time: 300 sec As can be seen from FIG. 5A and FIG. 5B, as compared to the sample A (FIG. 5A) on which only the film formation is performed, the sample B (FIG. 5B) on which the surface modification processing is performed by irradiating the microwave hydrogen plasma exhibits a low H concentration in a range of about 10 nm from the surface thereof, so that a composition thereof becomes closer to $Si_3N_4$ (N/Si~1.3). Further, the sample B also exhibits a higher density. As can be seen from this comparison, it is found out that the modified layer having a less amount of the hydrogens and a higher density is formed in the range of about 10 nm from the surface of the SiN film by the irradiation of the microwave hydrogen plasma.

Figure 6:
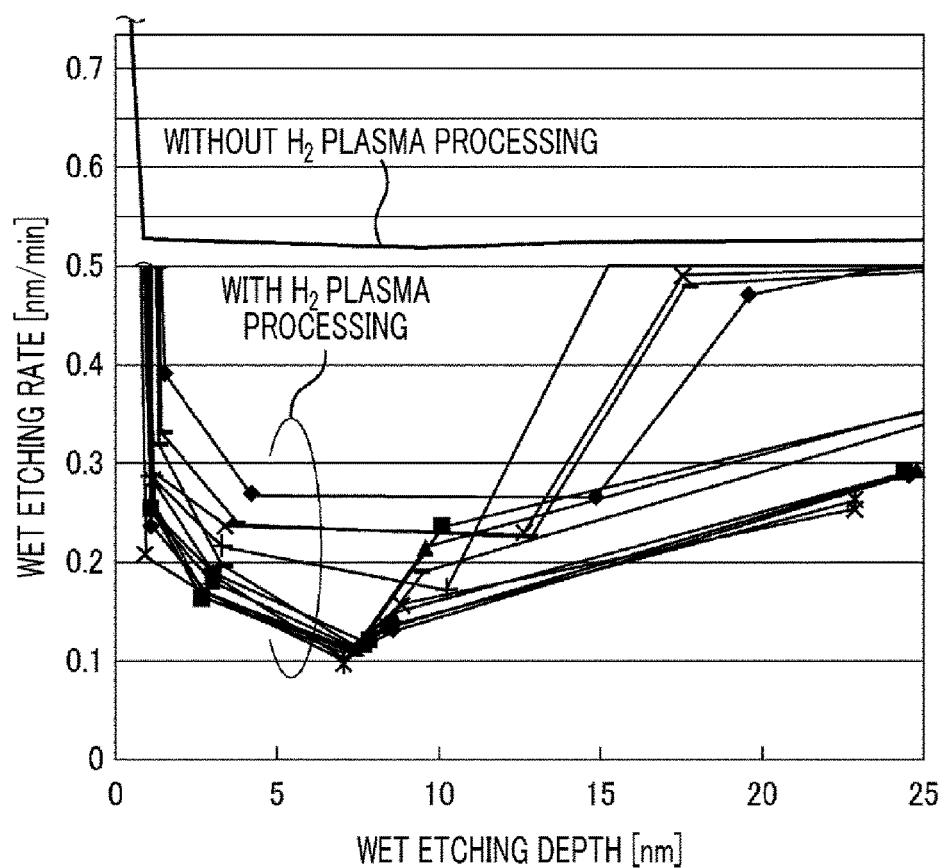
FIG. 6 is a diagram showing wet etching depths and wet etching rates of the sample A and the sample B.

Next, the wet etching is performed on the sample A and the sample B with dilute hydrofluoric acid (DHF) of 0.5%. FIG. 6 shows a relationship between a wet etching depth and a wet etching rate. For the sample B, the etching rates are measured at respective positions at the wafer W, whereas, for the sample A, the etching rate is measured at one position. As shown in this figure, in the sample B, the wet etching rates are in a range from 0.3 nm/min to 0.5 nm/min in a portion deeper than the modified layer, i.e., deeper than the depth of 10 nm, and most of the wet etching rates are found to decrease rapidly to 0.1 nm/min to 0.2 nm/min in a portion up to the depth of 10 nm corresponding to the modified layer. In contrast, in the sample A on which only the film formation of the SiN film is performed, the etching rate is found to be equal to or higher than 0.5 nm/min in the whole depth range. From this experiment, it is found out that the high etching selectivity is obtained by the surface modification processing through the irradiation of the microwave hydrogen plasma.

<Other Applications>

So far, the exemplary embodiments have been described with reference to the accompanying drawings. However, it should be noted that the exemplary embodiments are not limiting and various modifications may be made without departing from the scope and spirit of the present disclosure. By way of example, in the above-described exemplary embodiments, the surface modification processing is performed on the SiN film which is formed by the plasma CVD using the microwave plasma. However, the SiN film may be formed by CVD using another type of plasma such as ICP.

Furthermore, in the above-described exemplary embodiments, though the microwave plasma processing apparatus is implemented by the RLSA (registered trademark) microwave plasma processing apparatus, the exemplary embodiments are not limited thereto.

Moreover, the substrate on which the SiN film is formed may not be limited to the semiconductor wafer but may be of another type such as a FPD (flat panel display) substrate or a ceramic substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A forming method of a silicon nitride film, the forming method comprising:
  a first process of forming the silicon nitride film on a substrate by plasma CVD;
  a second process of modifying a surface portion of the silicon nitride film by irradiating microwave hydrogen plasma to the silicon nitride film to remove hydrogens in the surface portion of the silicon nitride film with atomic hydrogens contained in the microwave hydrogen plasma,
  wherein the first process is performed by microwave plasma, and
  the first process and the second process are performed consecutively in a same microwave plasma processing apparatus.

2. The forming method of the silicon nitride film of claim 1,
  wherein the silicon nitride film is formed by microwave plasma CVD.

3. The forming method of the silicon nitride film of claim 1,
  wherein the microwave hydrogen plasma is generated by exciting a hydrogen gas, or by exciting a hydrogen gas and an inert gas with microwave.

4. The forming method of the silicon nitride film of claim 1,
  wherein a processing temperature when irradiating the microwave hydrogen plasma is in a range from 200° C. to 500° C.

5. The forming method of the silicon nitride film of claim 1,
  wherein a processing pressure when irradiating the microwave hydrogen plasma is in a range from 10 Pa to 100 Pa.

6. The forming method of the silicon nitride film of claim 1,
  wherein a depth of a modified portion of the surface portion of the silicon nitride film is equal to or larger than 10 nm.

7. The forming method of the silicon nitride film of claim 1,
  wherein the irradiating of the microwave hydrogen plasma is performed by a RLSA (registered trademark) microwave plasma processing apparatus.

8. The forming method of the silicon nitride film of claim 1, wherein the microwave plasma processing apparatus is a RLSA (registered trademark) microwave plasma processing apparatus.

9. The forming method of the silicon nitride film of claim 1, wherein the first process and the second process are performed at a same processing temperature.

10. The forming method of the silicon nitride film of claim 1, wherein a processing temperature of the first process is in a range from 200° C. to 500° C.

11. The forming method of the silicon nitride film of claim 1, wherein a processing pressure of the first process is in a range from 10 Pa to 100 Pa.

* * * * *

UNITED STATES PATENT AND TRADEMARK OFFICE
CERTIFICATE OF CORRECTION

PATENT NO. : 10,017,853 B2
APPLICATION NO. : 15/615945
DATED : July 10, 2018
INVENTOR(S) : Toshio Nakanishi et al.

It is certified that error appears in the above-identified patent and that said Letters Patent is hereby corrected as shown below:

In the Specification

Column 4, Line 17, "H" should be -- $H^*$ --.

Signed and Sealed this
Thirteenth Day of November, 2018

Andrei Iancu
*Director of the United States Patent and Trademark Office*